United States Patent
Hempel et al.

(10) Patent No.: US 9,917,016 B2
(45) Date of Patent: Mar. 13, 2018

(54) INTEGRATED CIRCUITS AND METHODS OF FORMING THE SAME WITH EFFECTIVE DUMMY GATE CAP REMOVAL

(71) Applicant: GLOBALFOUNDRIES, Inc., Grand Cayman (KY)

(72) Inventors: Klaus Hempel, Dresden (DE); Dina Triyoso, Mechanicville, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/567,544

(22) Filed: Dec. 11, 2014

(65) Prior Publication Data
US 2016/0172251 A1    Jun. 16, 2016

(51) Int. Cl.
| | |
|---|---|
| H01L 21/8238 | (2006.01) |
| H01L 29/66 | (2006.01) |
| H01L 27/092 | (2006.01) |
| H01L 21/311 | (2006.01) |
| H01L 21/3213 | (2006.01) |

(52) U.S. Cl.
CPC ........ H01L 21/823828 (2013.01); H01L 21/823842 (2013.01); H01L 27/092 (2013.01); H01L 29/6656 (2013.01); H01L 29/66545 (2013.01); *H01L 21/31116* (2013.01); *H01L 21/32133* (2013.01); *H01L 29/665* (2013.01)

(58) Field of Classification Search
CPC ........ H01L 29/66545; H01L 29/66606; H01L 29/66871; H01L 21/823437; H01L 21/8238

See application file for complete search history.

(56) References Cited

U.S. PATENT DOCUMENTS

| | | | |
|---|---|---|---|
| 2009/0206416 A1* | 8/2009 | Cheng ............ | H01L 21/82384 257/369 |
| 2010/0059833 A1* | 3/2010 | Yu ................ | H01L 21/82380 257/410 |
| 2014/0191295 A1* | 7/2014 | Greene ............ | H01L 21/28 257/288 |
| 2015/0162416 A1* | 6/2015 | Chang ............. | H01L 29/6656 257/288 |

* cited by examiner

*Primary Examiner* — Daniel Whalen
*Assistant Examiner* — Suberr Chi
(74) *Attorney, Agent, or Firm* — Lorenz & Kopf, LLP

(57) ABSTRACT

Integrated circuits and methods of forming the same are provided. An exemplary method of forming an integrated circuit includes forming a dummy gate structure overlying a semiconductor substrate. The dummy gate structure includes a gate dielectric layer, a dummy gate layer, an etch stop layer, and a dummy gate cap layer. First sidewall spacers are formed adjacent to sidewalls of the dummy gate structure. A source and drain region are formed in the semiconductor substrate adjacent to the first sidewall spacers. A dielectric material is deposited adjacent to the first sidewall spacers. The dummy gate cap layer is etched with a first etchant selective thereto after depositing the dielectric material. The etch stop layer is etched with a second etchant that is selective thereto. The dummy gate layer is etched to form a gate recess, and a gate material is deposited in the gate recess.

11 Claims, 3 Drawing Sheets

INTEGRATED CIRCUITS AND METHODS OF FORMING THE SAME WITH EFFECTIVE DUMMY GATE CAP REMOVAL

TECHNICAL FIELD

The technical field generally relates to integrated circuits and methods of forming the integrated circuits using replacement metal gate techniques. More particularly, the technical field relates to methods of forming integrated circuits through replacement metal gate techniques with effective dummy gate cap layer removal.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions.

The ICs are usually formed using both P-channel FETs (PMOS transistors or PFETs) and N-channel FETs (NMOS transistors or NFETs), and the IC is then referred to as a complementary MOS or CMOS circuit. Some semiconductor ICs, such as high performance microprocessors, can include millions of FETs. Replacement metal gate (RMG) techniques are often employed to form the PFETs and NFETs, with gate electrode structures for the PFETs and NFETs being formed after formation of the source and drain regions. During RMG techniques, a dummy gate structure is formed that includes a gate dielectric layer, a dummy gate layer overlying the gate dielectric layer, and a nitride dummy gate cap overlying the dummy gate layer to protect the dummy gate from silicidation during source and drain formation (silicidation of the dummy gate layer would otherwise render etching of the dummy gate layer difficult). Sidewall spacers are formed adjacent to sides of the dummy gate and nitride cap, followed by source and drain region formation and deposition of a dielectric layer overlying the semiconductor substrate. The nitride dummy gate cap is removed through chemical mechanical planarization (CMP) and the dummy gate layer is then etched using appropriate etchants, leaving the sidewall spacers with a gate recess defined therebetween. Gate material is then deposited in the gate recess to form the gate electrode structures.

During fabrication of ICs with both PFETs and NFETs, different implantation and gate formation techniques are employed, resulting in variations in height of the nitride dummy gate cap for PFETs and NFETs. The variations in height of the nitride cap often impact CMP and may result in incomplete removal of the nitride cap. Without complete removal of the nitride cap, incomplete etching of the dummy gate layer may result and thereby impact device yield. Layout details including element density also impact CMP removal rates and may result in different dummy gate layer heights depending upon widths of different gates disposed on the semiconductor substrate. With different dummy gate layer heights, heights of resulting gate electrodes formed in the gate recesses result, thereby impacting quality of the ICs.

Accordingly, it is desirable to provide integrated circuits and methods of forming the integrated circuits with effective dummy gate cap removal. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods of forming the same are provided herein. In an exemplary embodiment, a method of forming an integrated circuit includes forming a dummy gate structure overlying a semiconductor substrate. The dummy gate structure includes a gate dielectric layer, a dummy gate layer that overlies the gate dielectric layer, an etch stop layer that overlies the dummy gate layer, and a dummy gate cap layer that overlies the etch stop layer. First sidewall spacers are formed adjacent to sidewalls of the dummy gate structure. A source region and a drain region are formed in the semiconductor substrate adjacent to the first sidewall spacers. A dielectric material is deposited adjacent to the first sidewall spacers. The dummy gate cap layer is etched with a first etchant that is selective to the dummy gate cap layer after depositing the dielectric material adjacent to the first sidewall spacers. The etch stop layer is etched with a second etchant that is selective to the etch stop layer. The dummy gate layer is etched to form a gate recess, and a gate material is deposited in the gate recess to form a gate electrode layer.

In another exemplary embodiment, a method of forming an integrated circuit includes forming a first dummy gate structure and a second dummy gate structure overlying a semiconductor substrate. The first dummy gate structure and the second dummy gate structure include a gate dielectric layer, a dummy gate layer, an etch stop layer that overlies the dummy gate layer, and a dummy gate cap layer that overlies the etch stop layer. First sidewall spacers are formed adjacent to sidewalls of the first dummy gate structure and the second dummy gate structure. A source region and a drain region are formed in the semiconductor substrate adjacent to the first sidewall spacers. A dielectric material is deposited adjacent to the first sidewall spacers after forming the source region and the drain region. The dummy gate cap layer of the first dummy gate structure and the second dummy gate structure are etched after depositing the dielectric material adjacent to the first sidewall spacers. The etch stop layer of the second dummy gate structure is masked, and the etch stop layer of the first dummy gate structure is etched after masking the etch stop layer of the second dummy gate structure. The dummy gate layer of the first dummy gate structure is etched after etching the etch stop layer of the first dummy gate structure to form a first gate recess. A first work-function determining material is deposited in the first gate recess. The etch stop layer of the second dummy gate structure is etched after depositing the first work-function determining material in the first gate recess.

In another embodiment, an integrated circuit includes a P-type metal oxide semiconductor field effect transistor (MOSFET) and an N-type MOSFET formed on a semiconductor substrate. The P-type MOSFET includes a P-type gate electrode structure. The P-type gate electrode structure includes a first electrode layer including a first work-function determining material and a second electrode layer including a second work-function determining material. The first electrode layer and the second electrode layer overlie a gate dielectric layer. The N-type MOSFET includes an N-type gate electrode structure. The N-type gate electrode structure includes the second electrode layer including the second work-function determining material. The second electrode layer overlies the gate dielectric layer, and the N-type gate electrode structure is free of the first electrode layer. The P-type and N-type MOSFETs are free from a sub-gate electrode etch stop layer disposed between the electrode layers and the gate dielectric layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
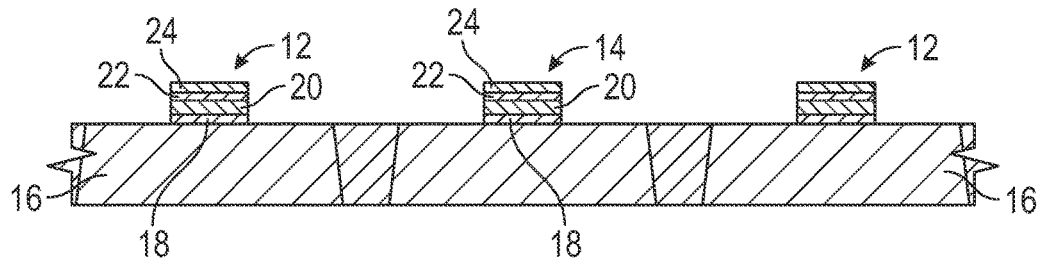
FIGS. 1-6 are schematic cross-sectional side views of an integrated circuit and a method of forming the same in accordance with an embodiment.

The following detailed description is merely exemplary in nature and is not intended to limit the invention or the application and uses of the invention. Furthermore, there is no intention to be bound by any theory presented in the preceding background or the following detailed description.

Integrated circuits and methods of forming integrated circuits with effective dummy gate cap removal are provided. In particular, the integrated circuits are formed through a replacement metal gate (RMG) technique by which a dummy gate structure is first formed, followed by source and drain region formation, dummy gate removal, and formation of a gate electrode in place of the dummy gate. The dummy gate structure includes a gate dielectric layer, a dummy gate layer overlying the gate dielectric layer, and a dummy gate cap layer overlying the dummy gate layer. As referring to herein, "RMG techniques" include both full replacement gate techniques by which all dummy gate material down to a gate dielectric is removed followed by replacement with high-k dielectric material and work function-determining material, and hybrid gate last techniques by which a high-K dielectric material is employed in the gate dielectric layer and a work-function determining layer is disposed between the gate dielectric layer and the dummy gate layer, with the work-function determining layer remaining after removal of the dummy gate layer. As referred to herein, "high-K dielectric material" is a dielectric material having a K value greater than about 3.8 (the dielectric constant "K" for silicon oxide). Unlike conventional RMG techniques, the dummy gate structure further includes an etch stop layer disposed between the dummy gate cap layer and the dummy gate layer, thereby enabling removal of the dummy gate cap layer through etching techniques rather than chemical mechanical planarization (CMP). As a result, over-etch of the dummy gate cap layer may be conducted to avoid incomplete removal of the dummy gate cap layer while structures underlying the etch stop layer maintain consistent dimensions, even under circumstances in which the dummy gate cap layers of different dummy electrode structure have different thicknesses. Thus, inconsistent dummy gate cap layer thicknesses will not impact thickness of the underlying dummy gate layer because etching terminates at the etch stop layer, unlike CMP. Further, thinner dummy gate cap layers may be employed as compared to RMG techniques that employ CMP to remove the dummy gate cap layer, thereby minimizing shadowing effects during source and drain region formation.

Various steps in the manufacture of MOS components are well known and so, in the interest of brevity, many conventional steps will only be mentioned briefly herein or will be omitted entirely without providing the well-known process details. As used herein, the term "MOS transistor" properly refers to a device having a gate electrode formed of a metal-containing material and an oxide gate insulator, although it is understood that the term may also be used to refer to any semiconductor device that includes a conductive gate electrode (whether metal or other conductive material) that is positioned overlying a gate insulator (whether oxide or other insulator) which, in turn, is positioned overlying a semiconductor substrate.

An exemplary method of forming an integrated circuit will now be described with reference to FIGS. 1-6. Referring to FIG. 1, a dummy gate structure 12 is formed overlying a semiconductor substrate 16. In embodiments, a plurality of dummy gate structures 12, 14 are formed, although it is to be appreciated that millions of dummy gate structures 12, 14 may be formed in accordance with the methods described herein. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. The semiconductor material is preferably a silicon substrate. The silicon substrate may be a bulk silicon wafer or may be a thin layer of silicon on an insulating layer (commonly known as silicon-on-insulator or SOI) that, in turn, is supported by a carrier wafer.

In embodiments and as alluded to above, the plurality of the dummy gate structures 12, 14 is formed overlying the semiconductor substrate 16, including a first dummy gate structure 12 and a second dummy gate structure 14. As described herein, the first dummy gate structure 12 refers to dummy gate structures that are employed for forming P-type field effect transistors (PFETs) and the second dummy gate structure 14 refers to dummy gate structures that are employed for forming N-type field effect transistors (NFETs). The dummy gate structures 12, 14 are formed in accordance with a replacement metal gate (RMG) technique for forming the PFETs and NFETs, with portions of the dummy gate structures ultimately removed and replaced with gate electrode material once harsh fabrication techniques associated with source and drain region formation for the PFETs and NFETs are complete.

In embodiments, the dummy gate structures 12, 14 include a gate dielectric layer 18, a dummy gate layer 20 overlying the gate dielectric layer 18, an etch stop layer 22 overlying the dummy gate layer 20, and a dummy gate cap layer 24 overlying the etch stop layer 22. As used herein, the term "overlying" is used to encompass both "over" and "on". In this regard, one feature that overlies a second feature may include intervening features, such as a layer, interposed between the one feature and the second feature within the scope of the term "overlying". Alternatively, the one feature may be formed directly on a surface of the second feature within the scope of the term "overlying". The aforementioned layers, as referred to herein, may each include one or more individual layers of different material that, together, perform the recited function. For example, the gate dielectric layer 18 may include one or more individual layers that include different dielectric materials. In embodiments and although not shown, a layer of first work-function determining material may be formed between the gate dielectric layer 18 and the dummy gate layer 20 in accordance with conventional hybrid gate last techniques.

The gate dielectric layer 18 may include an insulator material such as, but not limited to, silicon dioxide, silicon oxide, silicon nitride, or the like. In embodiments, such as for the hybrid gate last techniques, the gate dielectric layer 18 may include a high-K material. As referred to herein, "high-k material", or high dielectric constant material, is a material that has a dielectric constant that is greater than silicon (dielectric constant of 3.7). Examples of suitable high-k dielectric materials include, but are not limited to, hafnium oxide, lanthanum oxide, zirconium oxide, tungsten oxide, iridium oxide, aluminum oxide, and the like. The optional layer of first work-function determining material may include P-type work-function determining material, an example of which includes titanium nitride. The dummy gate layer 20 may include any material that can be selectively etched from first sidewall spacers that are described in further detail below. In various embodiments, suitable materials for the dummy gate layer 20 include, but are not limited to, silicon oxide, silicon nitride, polycrystalline silicon, amorphous silicon, amorphous carbon (a-C), a carbon-doped silica (SiCOH), or another material suitable for providing mechanical support for sidewall spacers to be formed in a manner described in detail below. The etch stop layer 22 may include any material that can be selectively etched from the dummy gate layer 20 and that is resistant to etching from a first etchant that is employed to etch the dummy gate cap layer 24, as described in further detail below. By "resistant to etching", it is meant that the material of the etch stop layer 22 has a removal rate that is less than about 10%, such as less than about 1%, of the removal rate of the material of the dummy gate cap layer 24. In embodiments, the etch stop layer 22 comprises a metal chosen from titanium or tantalum. Examples of suitable materials for the etch stop layer 22 include, but are not limited to, titanium nitride or tantalum nitride. An example of a suitable material for the dummy gate cap layer 24 includes silicon nitride. In embodiments, due to the unique structure and removal techniques employed for removing the dummy gate cap layer 24 (described in further detail below), the dummy gate cap layer 24 may be thinner than conventional dummy gate cap layers. In embodiments, the dummy gate cap layer 24 has a thickness of less than about 15 nm, such as from about 5 to about 15 nm, or such as from about 5 to about 10 nm.

In embodiments, the dummy gate structures 12, 14 are formed by depositing the gate dielectric material overlying the semiconductor substrate 16 to form the gate dielectric layer 18, depositing the dummy gate material overlying the gate dielectric layer 18 to form the dummy gate layer 20, depositing the etch stop material overlying the dummy gate layer 20 to form the etch stop layer 22, and depositing the dummy gate cap material overlying the etch stop layer 22 to form the dummy gate cap layer 24. Recesses are patterned through the dummy gate cap layer 24, the etch stop layer 22, the dummy gate layer 20, and the gate dielectric layer 18 to form the dummy gate structures 12, 14, and conventional lithography techniques may be employed for patterning.

Figure 2:
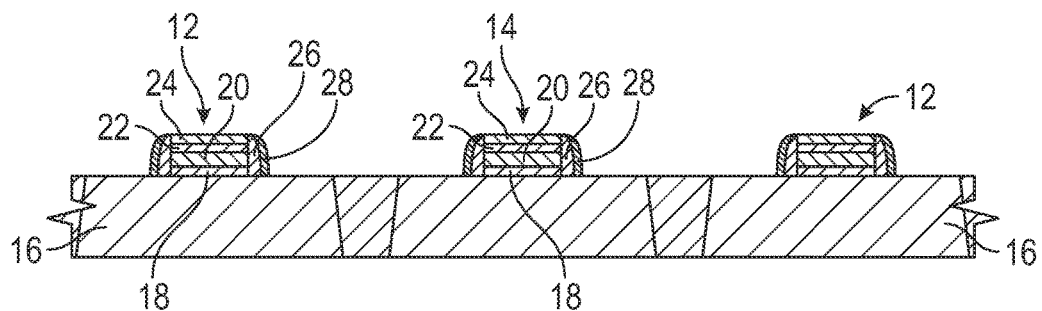

Referring to FIG. 2, sidewall spacers 26, 28 are formed adjacent to sidewalls of the dummy gate structures 12, 14. By "adjacent", it is meant that the sidewall spacers 26, 28 are formed next to the sidewalls of the dummy gate structures 12, 14, optionally with intervening structures disposed between the sidewall spacers 26, 28 and the sidewalls of the dummy gate structures 12, 14. In embodiments, the first sidewall spacers 26 are formed directly upon sidewalls of the dummy gate structures 12, 14, and the second sidewall spacers 28 are formed directly on the first sidewall spacers 26. In embodiments, the sidewall spacers 26, 28 may be formed in accordance with conventional techniques and may be formed from conventional materials. In other embodiments, first sidewall spacers 26 that include silicon oxynitride (SiON) are formed adjacent to sidewalls of the dummy gate structures 12, 14 for purposes of protecting the dummy gate layer 20 against harsh processing conditions during silicidation techniques that are employed during source and drain region formation. SiON is more resistant to harsh conditions during silicidation than conventional spacer materials such as silicon nitride. In the absence of the first sidewall spacers 26 that include SiON, corners of the dummy gate layer 20 may become exposed and silicided during silicidation, thereby rendering later removal of the dummy gate layer 20 more difficult. With the presence of the first sidewall spacers 26 and the etch stop layer 22, the dummy gate layer 20 is effectively encapsulated and protected from possible silicidation during source and drain region formation.

In embodiments, the first sidewall spacers 26 are formed by depositing silicon nitride overlying the sidewalls of the dummy gate structures 12, 14 and converting the silicon nitride to silicon oxynitride. For example, the silicon nitride may be deposited through atomic layer deposition (ALD) overlying the sidewalls of the dummy gate structures 12, 14, as well as over the surface of the semiconductor substrate 16 and the dummy gate cap layer 24, followed by anisotropic etching to remove the ALD-deposited silicon nitride from over the surface of the semiconductor substrate 16 while generally leaving silicon nitride that overlies vertical surfaces (i.e., the sidewalls of the dummy gate structures 12, 14) as well as silicon nitride of the dummy gate cap layer 24. For example, anisotropic etching may be performed by plasma etching or RIE using chemistries based upon carbon trifluoride/oxygen ($CHF_3/O_2$) to etch silicon nitride. The silicon nitride that overlies the sidewalls of the dummy gate structures 12, 14 is then converted to silicon oxynitride through plasma oxidation to form the first sidewall spacers 26. However, it is to be appreciated that other techniques for forming the first sidewall spacers 26 may be employed. In embodiments, the first sidewall spacers 26 have a width of from about 3 to about 5 nm.

In embodiments and as set forth above, the second sidewall spacers 28 are formed overlying the first sidewall spacers 26. The second sidewall spacers 28 may be conventional sidewall spacers formed in accordance with conventional techniques for forming source and drain regions in the semiconductor substrate 16 for the dummy gate structures 12, 14. In embodiments, the second sidewall spacers 28 include silicon nitride and are formed by blanket deposition/anisotropic etching after formation of the first sidewall spacers 26.

Figure 3:
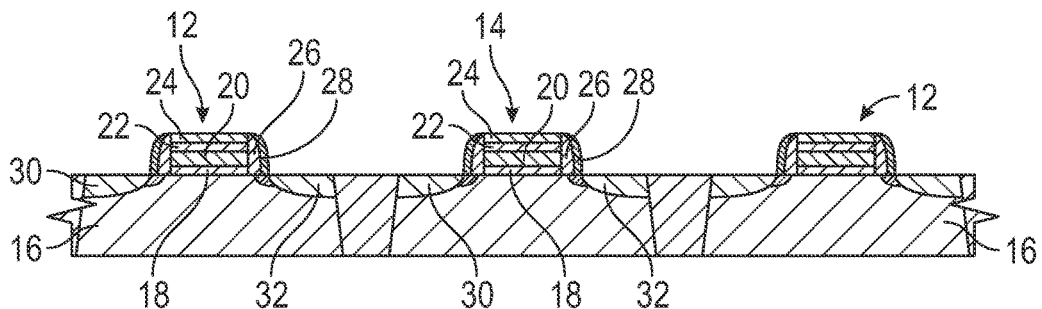

After forming the second sidewall spacers 28 and referring to FIG. 3, source regions 30 and drain regions 32 are formed in the semiconductor substrate 16 adjacent to the second sidewall spacers 28. Conventional techniques may be employed to form the source regions 30 and the drain regions 32, including formation of extension and/or halo regions for the source region 30 and the drain region 32. It is to be appreciated that, although not shown in detail, different source and drain formation techniques and structures may be formed for PFETs and NFETs in accordance with conventional IC fabrication techniques. Additionally, conventional silicidation of a surface of the source regions 30 and the drain regions 32 may be conducted during source and drain region formation. Conventional silicidation techniques generally include blanket metal deposition through techniques such as ALD followed by annealing, which forms a thin layer of metal silicide on the surface of the source region 30 and the drain region 32.

Figure 4:
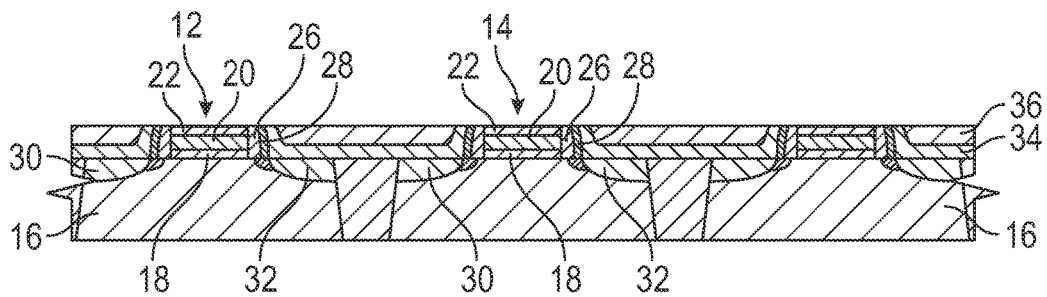

Referring to FIG. 4, after forming the source regions 30 and the drain regions 32, dielectric material is deposited adjacent to the first sidewall spacers 26. More specifically, in the embodiment shown where the second sidewall spacers 28 are present, the dielectric material is deposited directly adjacent to the second sidewall spacers 28. In embodiments, multiple layers of dielectric material may be deposited adjacent to the first sidewall spacers 26. For example, in an embodiment and as shown in FIG. 4, a layer of plasma-enhanced nitride (PEN) 34 may be formed, followed by forming a layer of oxide 36. In embodiments, the layer of PEN 34 is formed and the oxide 36 is deposited to overfill spaces between dummy gate structures 12, 14, followed by conducting CMP that is selective to oxide and silicon nitride. Such CMP techniques stop on the PEN layer 34, with the dummy gate cap layer remaining in place. In other embodiments, the PEN layer 34 is formed and the oxide is deposited to form the layer of oxide 36 at about even height with the dummy gate cap layer. In both embodiments (i.e., overfill or deposition of oxide 36 to about even height with the dummy gate cap layer) and although not shown in FIG. 4, at least a portion of the dummy gate cap layer remains with the resulting layer of oxide 36 at about even height with the dummy gate cap layer. More specifically, at least a portion of the dummy gate cap layer remains after any CMP that is conducted to remove oxide 36.

Referring again to FIG. 4, the dummy gate cap layer is etched with a first etchant that is selective to the dummy gate cap layer over the etch stop layer 22 after depositing the dielectric material adjacent to the first sidewall spacers 26. In embodiments, the first etchant is selective to silicon nitride over titanium nitride for purposes of removing the dummy gate cap layer while leaving at least a portion of the etch stop layer 22 disposed over the dummy gate layer 20. In embodiments, the dummy gate cap layer is etched through reactive ion etching (RIE) that is selective to silicon nitride and silicon oxide, such as RIE with the first etchant including carbon tetrafluoride ($CF_4$), optionally with $O_2$. Alternatively, RIE may be employed using $SF_6$, optionally with $O_2$, as the first etchant. It is to be appreciated that various other conventional etching chemistries and techniques are also selective to silicon nitride over titanium nitride. Because the dummy gate cap layer is removed through etching with the first etchant as opposed to CMP, and because the etch stop layer 22 is substantially resistant to the first etchant, the resulting etch stop layer 22 of all dummy gate structures 12, 14 will be at substantially even height.

Figure 5:
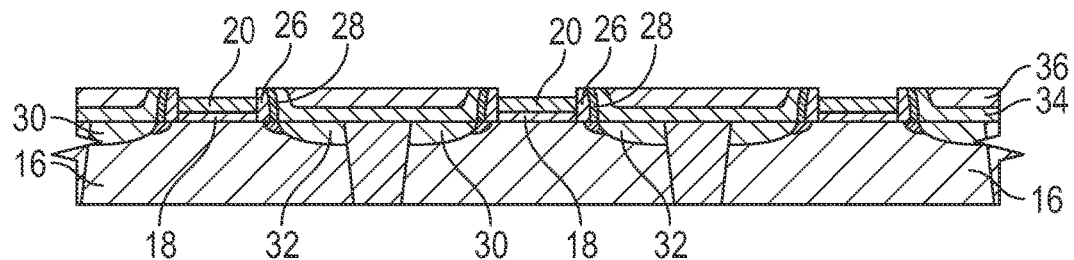

In an embodiment and referring to FIG. 5, after etching the dummy gate cap layer, the etch stop layer is etched with a second etchant that is selective to the etch stop layer over the dummy gate layer 20. In embodiments, the etch stop layer includes titanium nitride and may be etched using an ammonia-peroxide mixture (APM) as the second etchant or a sulfuric-peroxide mixture (SPM) as the second etchant. In the embodiment shown in FIG. 5, the etch stop layer is concurrently removed from all dummy gate layers 20. However, in other embodiments and as described in further detail below, some of the etch stop layers may be removed first with other etch stop layers removed at different process stages for purposes of conducting techniques that are specific to the type of FET that is to be formed while protecting the dummy gate layer 20.

Figure 6:
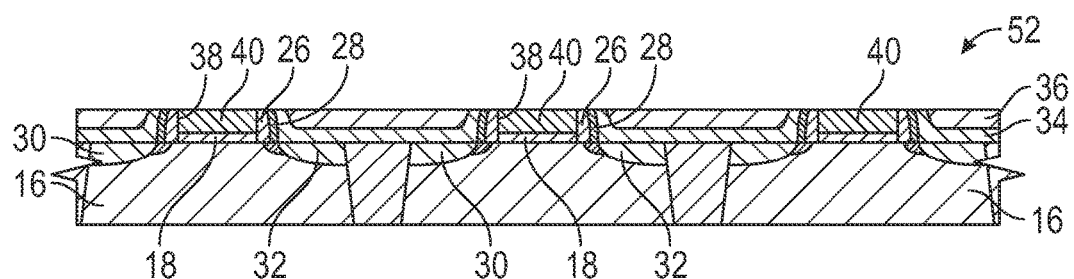

After etching the etch stop layer, further techniques may be conducted in accordance with conventional RMG processing. In particular, referring to FIG. 6, the dummy gate layer may be etched after etching the etch stop layer to form a gate recess 38. In the embodiment shown, the gate dielectric layer 18 remains in place. Gate material may then be deposited in the gate recesses 38 to form a gate electrode layer 40, and it is to be appreciated that one or more layers of different gate material may be deposited to form the gate electrode layer 40. The gate electrode layer 40 may include conventional materials including copper, silver, and doped or undoped polycrystalline silicon. FIG. 6 shows the resulting integrated circuit 52 formed in accordance with this embodiment.

Figure 7:
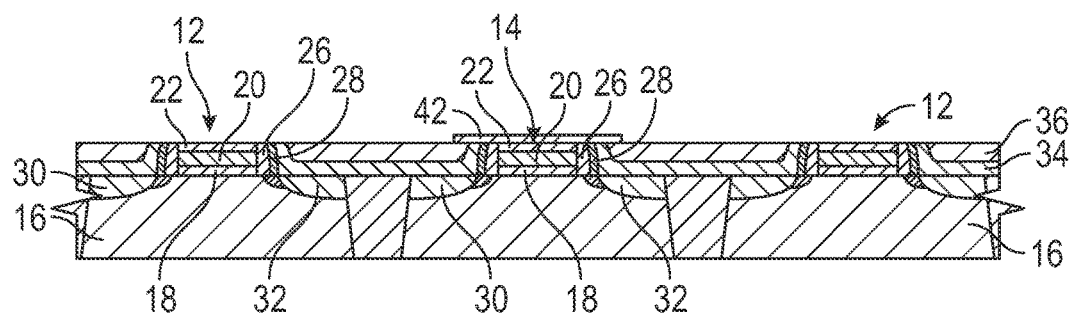
FIGS. 7-11 are schematic cross-sectional side views of an integrated circuit and a method of forming the same in accordance with another embodiment.
Figure 8:
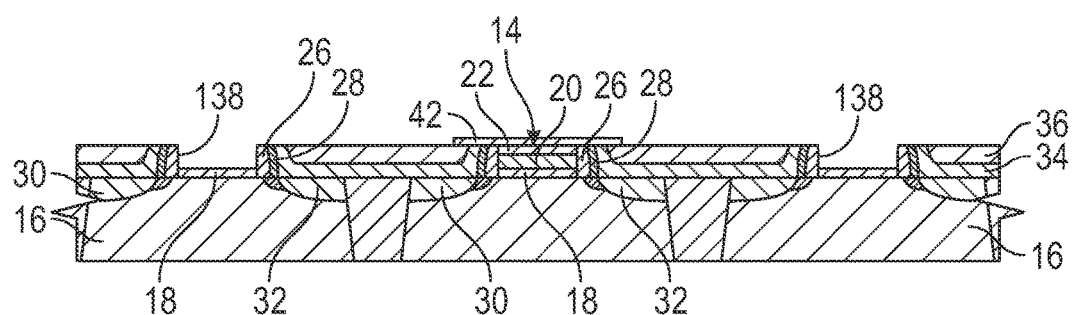

Another embodiment of an exemplary method of forming an integrated circuit will now be described with reference to FIGS. 7-11. In this embodiment, dummy gate structures 12, 14, first sidewall spacers 26, second sidewall spacers 28, source regions 30 and drain regions 32, and interlayer dielectric layers 34, 36 may be formed in the same manner as described above in regards to FIGS. 1-4. Additionally, the dummy gate cap layer 24 may be removed in the same manner as described above, with the etch stop layer 22 remaining in place over every dummy gate layer 20 as shown in FIG. 7. However, in this embodiment, etch stop layers 22 of the first dummy gate structure 12 where a PFET is to be formed are first removed while etch stop layers 22 of the second dummy gate structure 14 remain in place to enable RMG techniques that are specific to PFETs to be conducted before dummy gate pull of the second dummy gate structure 14 where an NFET is to be formed. In particular, in this embodiment and referring to FIG. 7, the etch stop layer 22 of the second dummy gate structures 14 where NFETs are to be formed are masked with an etch stop mask 42 and the etch stop layer 22 of first dummy gate structures 12 where PFETs are to be formed remain unmasked. Referring to FIG. 8, the unmasked etch stop layer of the first dummy gate structure is etched after masking the etch stop layer 22 of the second dummy gate structure 14, followed by etching the dummy gate layer of the first dummy gate structure after etching the etch stop layer of the first dummy gate structure to form a first gate recess 138. The etch stop layer 22 of the second dummy gate structure 14 remains masked with the etch stop mask 42 during etching of the etch stop layer and dummy gate layer of the first dummy gate structure, with the etch stop layer 22 of the second dummy gate structure 14 unmasked by removing the etch stop mask 42 after etching of dummy gate layer of the first dummy gate structure.

Figure 9:
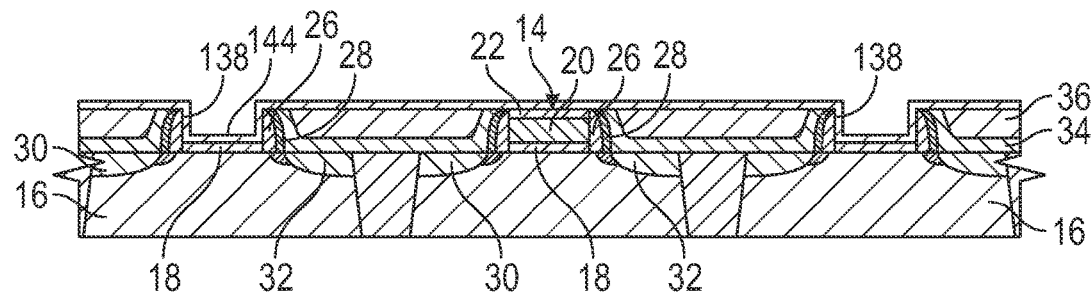

Referring to FIG. 9, a first work-function determining material is deposited in the first gate recess 138 to form a first electrode layer 144. The first work-function determining material is generally a high work function material that is desirable for the gate electrode in PFETs, but is undesirable in NFETs. For example the first work-function determining material may be titanium nitride. In embodiments, the first work-function determining material is blanket deposited, with the first work-function determining material deposited not only in the first gate recess 138 but also directly over the etch stop layer 22 of the second dummy gate structure 14. While FIG. 9 shows a single first electrode layer 144 formed, it is to be appreciated that multiple different layers of P-type work function determining material may be formed with all such layers represented by the first electrode layer 144.

Figure 10:
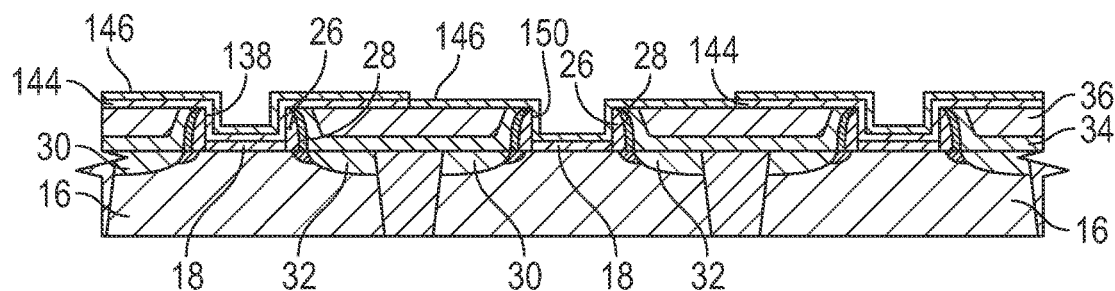

Referring to FIG. 10, after forming the first electrode layer 144, the etch stop layer 22 of the second dummy gate structures 14 where NFETs are to be formed is removed, followed by removal of the dummy gate layer 20 of the second dummy gate structures to form a second gate recess 150. Although not shown, the first electrode layer 144 in the first gate recess 138 may be masked during removal of the etch stop layer and the dummy gate layer of the second dummy gate structures. In embodiments, the etch stop layer and the first work-function determining material have substantially the same etch rate. By "substantially the same etch rate", it is meant that the etch stop layer and the first work-function determining material are formed from materials that are both etchable with the same type of etchant without material impact on other exposed surfaces (e.g., the oxide 36) that are not intended to be etched during removal of the etch stop layer and the first work-function determining material. For example, as set forth above, the first work-function determining material may include titanium nitride, and the etch stop layer 22 may also include titanium nitride. In these embodiments, the etch stop layer of the second dummy gate structure and the first work-function determining material that overlies the etch stop layer of the second dummy gate structure may be concurrently etched using the same etchant. By concurrent etching of the subject layers, process simplification is possible. In particular, a sub-dummy gate layer etch stop layer may be omitted in accordance with the embodiment shown in FIGS. 7-11. Conventional RMG techniques generally employ the sub-dummy gate etch stop layer disposed between the dummy gate layer and the gate dielectric layer when PFETs and NFETs are formed. Conventional sub-dummy gate etch stop layers generally include tantalum nitride. During conventional RMG techniques, the dummy gate layer is concurrently removed at locations where both PFETs and NFETs are to be formed. The P-type work-function determining material is blanket deposited in the gate recesses. The sub-dummy gate etch stop layer enables selective etching of the P-type work-function determining material from locations where NFETs are to be formed (with the P-type work-function determining material masked in areas where PFETs are to be formed). However, the sub-dummy gate etch stop layer often remains in place, at least beneath the gate electrode in the PFETs, and the presence of the sub-dummy gate etch stop layer may impact performance of the FETs. In the embodiment shown in FIGS. 7-11, even with the first dummy gate structure 12 and the second dummy gate structure 14 formed free of the sub-dummy gate etch stop layer disposed between the dummy gate layer 20 and the gate dielectric layer 18, the techniques described above in accordance with the embodiment shown in FIGS. 7-11 still enable fabrication of PFETs with the P-type work-function determining material and NFETs that are free of the P-type work-function determining material.

Conventional RMG techniques may proceed with formation of additional work-function determining layers and gate electrodes. In particular, referring again to FIG. 10, after etching the etch stop layer and the dummy gate layer of the second dummy gate structure, any mask that is formed over the first electrode layer 144 during etching of the etch stop layer and the dummy gate layer of the second dummy gate structure is removed, and a second work-function determining material is deposited to form a second electrode layer 146. The second work-function determining material may include an N-type work-function determining material, such as titanium aluminum. While FIG. 10 shows a single second electrode layer 146 formed, it is to be appreciated that multiple different layers of N-type work function determining material may be formed with all such layers represented by the second electrode layer 146. Gate material may then be deposited in the gate recesses 138, 150 to form a gate electrode layer 140, and it is to be appreciated that one or more layers of different gate material may be deposited to form the gate electrode layer 140. The gate electrode layer 140 may include conventional materials including aluminum, copper, silver, and doped or undoped polycrystalline silicon.

Figure 11:
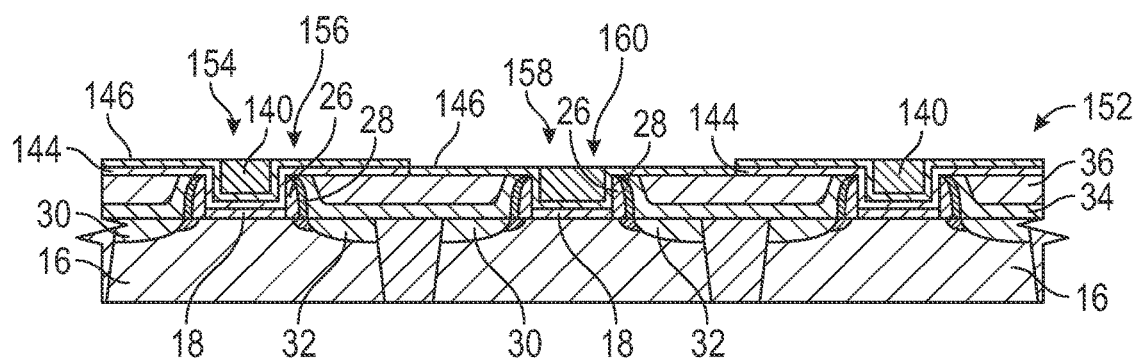

Referring to FIG. 11, the resulting integrated circuit 152 includes a P-type metal oxide semiconductor field effect transistor (MOSFET) 154 that is formed on the semiconductor substrate 16, with the P-type MOSFET 154 including a P-type gate electrode structure that includes the first electrode layer 144 and the second electrode layer 146. The first electrode layer 144 and the second electrode layer 146 overlie the gate dielectric layer 18. The integrated circuit 152 further includes an N-type MOSFET 158 that is formed on the semiconductor substrate 16, with the n-type MOSFET 158 including an N-type gate electrode structure 160 that includes the second electrode layer 146. The second electrode layer 146 overlies the gate dielectric layer 18 and the N-type gate electrode structure 160 is free of the first electrode layer. The MOSFETs 154, 158 are free from a sub-gate electrode etch stop layer disposed between the electrode layers 144, 146 and the gate dielectric layer 18.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit, wherein the method comprises:
 forming a first dummy gate structure and a second dummy gate structure overlying a semiconductor substrate, wherein the first dummy gate structure and the second dummy gate structure comprise a gate dielectric layer, a dummy gate layer, an etch stop layer overlying the dummy gate layer, and a dummy gate cap layer overlying the etch stop layer;
 forming first sidewall spacers adjacent to sidewalls of the first dummy gate structure and the second dummy gate structure;
 forming a source region and a drain region in the semiconductor substrate adjacent to the first sidewall spacers;
 depositing a dielectric material adjacent to the first sidewall spacers after forming the source region and the drain region;

etching the dummy gate cap layer of the first dummy gate structure and the second dummy gate structure after depositing the dielectric material adjacent to the first sidewall spacers;
masking the etch stop layer of the second dummy gate structure;
etching the etch stop layer of the first dummy gate structure after masking the etch stop layer of the second dummy gate structure;
etching the dummy gate layer of the first dummy gate structure after etching the etch stop layer of the first dummy gate structure to form a first gate recess;
depositing a first work-function determining material in the first gate recess; and
etching the etch stop layer of the second dummy gate structure after depositing the first work-function determining material in the first gate recess.

2. The method of claim 1, wherein forming the first sidewalls spacers comprises forming the first sidewall spacers comprising silicon oxynitride overlying the sidewalls of the dummy gate structure.

3. The method of claim 2, wherein forming the first sidewall spacers comprises depositing silicon nitride overlying the sidewalls of the dummy gate structure and converting the silicon nitride to silicon oxynitride.

4. The method of claim 2, further comprising forming second sidewall spacers overlying the first sidewall spacers, and wherein forming the source region and the drain region comprises forming the source region and the drain region in the semiconductor substrate adjacent to the second sidewall spacers.

5. The method of claim 3, wherein depositing the silicon nitride overlying the sidewalls comprises depositing the silicon nitride through atomic layer deposition overlying the sidewalls of the dummy gate structure.

6. The method of claim 3, wherein forming the first sidewall spacers comprises converting the silicon nitride overlying the sidewalls of the dummy gate structure to silicon oxynitride through plasma oxidation.

7. The method of claim 1, wherein forming the source region and the drain region further comprises siliciding a surface of the source region and the drain region.

8. The method of claim 1, further comprising unmasking the etch stop layer of the second dummy gate structure after etching the dummy gate layer of the first dummy gate structure.

9. The method of claim 8, wherein depositing the first work-function determining material comprises depositing the first work-function determining material in the first gate recess and directly over the etch stop layer of the second dummy gate structure.

10. The method of claim 9, wherein the etch stop layer and the first work-function determining material have substantially the same etch rate, and wherein etching the etch stop layer of the second dummy gate structure comprises concurrently etching the etch stop layer of the second dummy gate structure and the first work-function determining material overlying the etch stop layer of the second dummy gate structure using the same etchant.

11. The method of claim 1, wherein forming the first dummy gate structure and the second dummy gate structure comprises forming the first dummy gate structure and the second dummy gate structure free from a sub-dummy gate etch stop layer disposed between the dummy gate layer and the gate dielectric layer.

* * * * *